United States Patent
Larson et al.

(10) Patent No.: US 7,325,176 B2
(45) Date of Patent: Jan. 29, 2008

(54) SYSTEM AND METHOD FOR ACCELERATED INFORMATION HANDLING SYSTEM MEMORY TESTING

(75) Inventors: Mark A. Larson, Round Rock, TX (US); Lowell B. Dennis, Pflugerville, TX (US)

(73) Assignee: Dell Products L.P., Round Rock, TX (US)

( * ) Notice: Subject to any disclaimer, the term of this patent is extended or adjusted under 35 U.S.C. 154(b) by 732 days.

(21) Appl. No.: 10/786,254

(22) Filed: Feb. 25, 2004

(65) Prior Publication Data

US 2005/0188288 A1    Aug. 25, 2005

(51) Int. Cl.
*G11C 29/00*    (2006.01)

(52) U.S. Cl. ............................ 714/718; 714/5; 714/42; 714/720; 714/723; 365/201

(58) Field of Classification Search ................. 714/718
See application file for complete search history.

(56) References Cited

U.S. PATENT DOCUMENTS

| | | | | |
|---|---|---|---|---|
| 5,357,621 A | * | 10/1994 | Cox | 711/172 |
| 5,671,413 A | * | 9/1997 | Shipman et al. | 713/2 |
| 5,872,967 A | * | 2/1999 | DeRoo et al. | 713/2 |
| 5,954,831 A | * | 9/1999 | Chang | 714/720 |
| 6,317,853 B1 | * | 11/2001 | Hikone et al. | 714/738 |
| 6,516,410 B1 | * | 2/2003 | Heller | 713/2 |
| 6,550,023 B1 | * | 4/2003 | Brauch et al. | 714/42 |
| 6,694,468 B1 | | 2/2004 | Sun | 714/735 |
| 6,697,978 B1 | * | 2/2004 | Bear et al. | 714/718 |
| 6,711,675 B1 | | 3/2004 | Spiegel et al. | 713/2 |
| 6,728,911 B1 | | 4/2004 | Maynard et al. | 714/718 |
| 6,732,264 B1 | | 5/2004 | Sun et al. | 713/2 |
| 7,139,954 B1 | * | 11/2006 | Korhonen | 714/736 |
| 2003/0125908 A1 | * | 7/2003 | Wynn et al. | 702/186 |
| 2004/0068679 A1 | * | 4/2004 | Vellolil et al. | 714/42 |
| 2004/0073771 A1 | * | 4/2004 | Chen et al. | 711/218 |
| 2004/0181656 A1 | * | 9/2004 | Stern et al. | 713/1 |
| 2005/0081024 A1 | * | 4/2005 | Khatri et al. | 713/100 |

* cited by examiner

*Primary Examiner*—John P Trimmings
(74) *Attorney, Agent, or Firm*—Hamilton & Terrile, LLP; Robert W. Holland

(57) ABSTRACT

Memory testing at system startup, such as boot POST, of an information handling system is accelerated by adjusting memory testing routines to use instructions that take advantage of optimizations made to information handling system and CPU architectures. For instance, memory test iterations in one Mbyte portions using 128-bit SIMD registers, 64-bit MMX registers, ADD and SUB instructions, the MOVNTDQ instruction, and relying on an initial setting of the gate A20 and protected mode result in a substantially accelerated memory test.

20 Claims, 2 Drawing Sheets

SYSTEM AND METHOD FOR ACCELERATED INFORMATION HANDLING SYSTEM MEMORY TESTING

BACKGROUND OF THE INVENTION

1. Field of the Invention

The present invention relates in general to the field of information handling system memory test, and more particularly to a system and method for accelerated testing of information handling system memory.

2. Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

One trend that has emerged over the evolution of information handling systems is that the size of the random access memory (RAM) used in systems and demanded by consumers has steadily increased. Plentiful RAM aids in the speed at which an information handling system is able to operate by keeping a greater amount of data readily available for rapid access by processors. Further, RAM of all types has decreased in cost over time leading information handling system manufacturers and application designers to plan on the availability of increased amounts of RAM as designs progress.

Typically, information handling system manufacturers include instructions in a system BIOS or firmware to perform a brief test of the RAM at each system boot or other start-up routine. In addition, a more extensive memory test is performed any time memory is added to or removed from an information handling system or after power is removed, such as after the unplugging of a desktop information handling system's AC power cord. The memory test generally includes two separate types of test routines, each typically performed with 16-bit code. The first test routine is usually a walking 1s and walking 0s test that looks for errors at memory module boundaries. The second test routine is usually some sort of a pattern test that looks for stuck bit errors. Each of these test routines are iterative typically working on one 64 Kbyte block of memory at time. Each iteration usually includes a check and set up of gate A20, is preceded by entry into protected mode and followed by an exit from protected mode, and uses the WBINVD (writeback invalidate) instruction to make sure that the caches do not interfere with the test.

One difficulty that has arisen with the increased memory available on information handling systems is that the system startup time, such as the BIOS POST time, has grown along with memory size due the greater amount of time needed to perform the memory test. For instance, a conventional memory test on an exemplary information handling system with 4 Gbytes of RAM can take more than 12 minutes to complete. Excessive startup times have an adverse impact on users of information handling systems who often are frustrated by the delay imposed before the information handling system is operational. Businesses lose substantial worker productivity when workers wait idly for system startup to complete. However, incomplete memory tests that fail to identify memory failures can lead to even greater frustration and productivity loss when a user's data is inexplicably corrupted.

SUMMARY OF THE INVENTION

Therefore a need has arisen for a system and method which accelerates memory testing of an information handling system.

In accordance with the present invention, a system and method are provided which substantially reduce the disadvantages and problems associated with previous methods and systems for performing information handling system memory testing. Memory testing at system startup is accelerated by applying information handling system and central processing unit architecture and instruction improvements to more efficiently and rapidly execute the testing.

More specifically, a memory test module includes instructions to perform memory testing at startup of an information handling system with updated parameters. For instance, 32-bit code executes with ADD and SUB instructions on a CPU optimized for 32-bit code execution to generate and apply test data with the support of graphics-related architecture, such as the 128-bit SIMD (single instruction multiple data) extension and MMX registers within the CPU for temporary storage. The memory testing executes continuously in protected mode. A walking 1s and 0s routine and a multi-pattern routine are performed using a granularity that equals the block size of the memory banks, such as 1 Mbyte or greater iterations. Gate A20 is initialized once before applying test data and maintained throughout the memory test. The MOVNTDQ instruction is used to move the test data around in memory in a manner that bypasses the cache and thus avoids the need for repeated cache flushes. In this manner, the code is streamlined, the processing is minimized and the overhead of cache, gate A20 and protected mode manipulations are reduced or eliminated.

The present invention provides a number of important technical advantages. One example of an important technical advantage is that memory testing of an information handling system is accelerated without compromising the integrity of the testing performed. For instance, the 4 Gbyte example above applying the system and method herein completed the memory test in one minute and twenty seconds, 9 times faster than obtained by conventional systems and methods. Speedy execution of memory tests that are required in deployed information handling systems helps to improve the user experience by reducing frustrations and productivity losses related to excessive system startup wait times. Memory testing acceleration is supported through relatively inexpensive modifications to conventional testing performed by the system BIOS or firmware and therefore minimizes the impact on information handling system design and manufacture considerations.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Acceleration of an information handling system memory test provides more rapid system startup without compromising the integrity of the testing performed. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
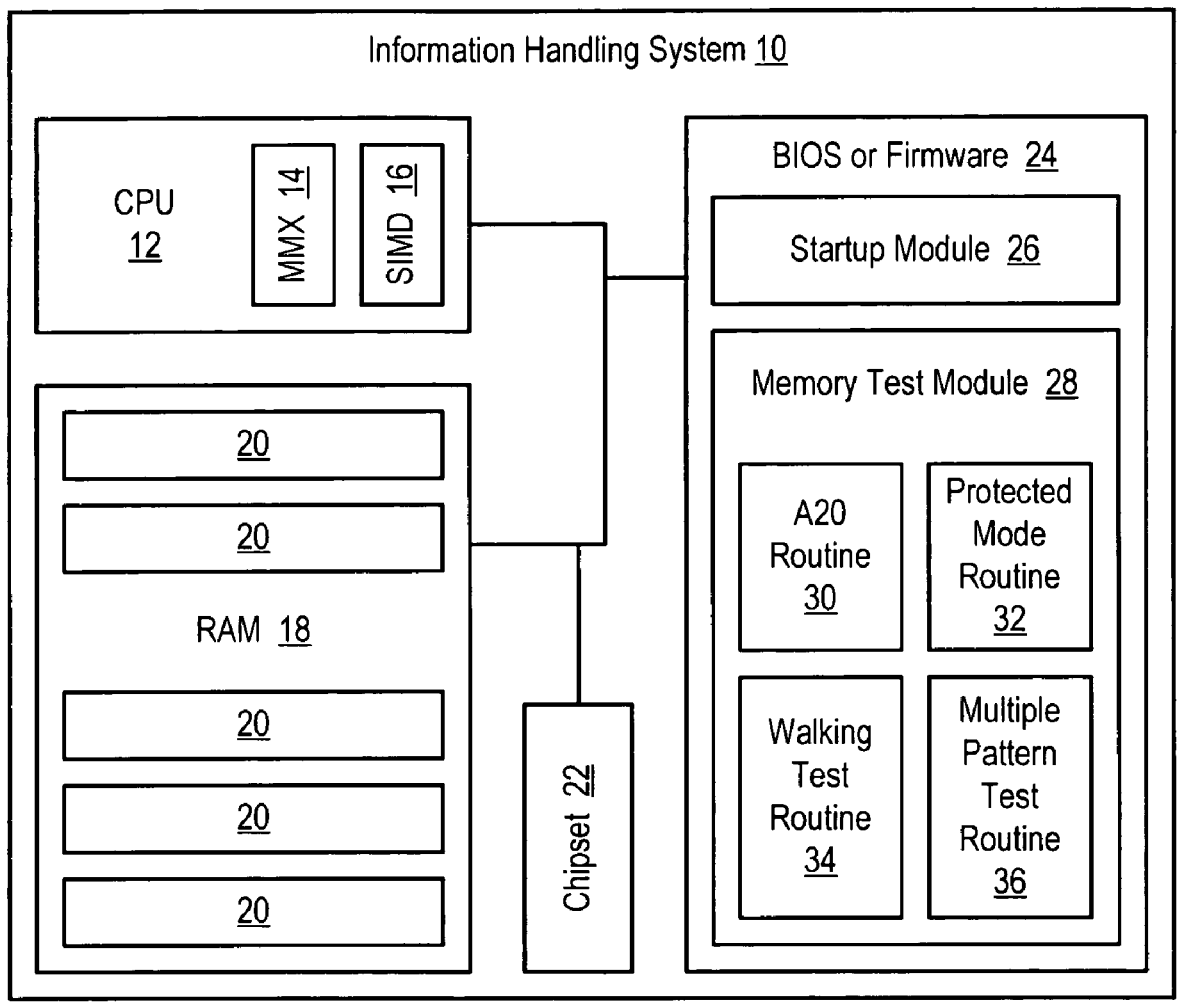
FIG. 1 depicts a block diagram of an information handling system configured for an accelerated memory test.

Referring now to FIG. 1, a block diagram depicts an information handling system 10 configured for an accelerated memory test. Information handling system 10 includes a CPU 12 having 64-bit MMX registers 14 and 128-bit SIMD registers 16. RAM 18 interfaces with CPU 12 to store information and includes a plurality of equal size blocks 20, such as 1 Mbyte blocks. A conventional chipset 22 supports external interfaces, such as with a display and other I/O devices. A BIOS or firmware module 24 coordinates operation of physical devices and initiates startup of information handling system 10 to call an operating system. A startup module 26 initiates required tests, such as a POST test, at power-up of system 10 and calls a memory test module to perform a memory test as part of this testing if appropriate, such as if RAM has been added to or removed from the system or AC power was disconnected from the system since the last startup. Memory test module 28 includes an A20 routine 30 and a protected mode routine 32 that set gate A20 appropriately and enter protected mode respectively upon initiation of the memory test and maintain the gate A20 and protected mode settings until the memory test is complete. This technique reduces execution time by eliminating the setting of gate A20 and the protected mode at each iteration of the memory test. A walking test routine 34 includes instructions for CPU 12 to generate walking 1s and 0s test data for writing to and reading from RAM 18. A multiple pattern test routine 34 includes instructions for CPU 12 to generate multi-pattern test data for writing to and reading from RAM 18.

Memory test module 28 accelerates the memory test by taking advantage of existing capabilities of CPU 12 to more efficiently generate test data and confirm the accuracy of the test data after storage on RAM 18. For instance, CPU's are generally based on the Pentium 4 architecture, which is optimized for 32-bit operations. Thus running 32-bit code to execute the memory test substantially improves performance over existing 16-bit code. Additional acceleration of the memory test is provided by executing code that communicates and stores test data during testing with registers integrated in CPU 12. For instance, use of the 128-bit SIMD registers 16 increase the execution of the walking 1s and 0s test by a factor of 4 over the use of 32-bit registers and increase the execution speed of the multi-pattern test by a factor of 2 over the use of 64-bit registers. Similarly, use of 64-bit MMX registers 14 for temporary storage of test data increases execution speed by replacing use of the stack with temporary storage integrated with CPU 12. In addition, memory testing is further accelerated by recognizing that the 64 Kbyte iteration size is a holdover from early designs in which memory was packaged in 64 Kbyte banks. Memory test module 28 provides CPU 12 with instructions to perform memory testing using block sizes that correspond to the typical bank size found in currently manufactured information handling systems, such as 1 Mbyte. As information handling systems advance to use greater bit code, more advanced internal registers and larger memory bank size, these constraints may be adjusted within memory test module 28 to further accelerate memory testing.

Memory test module 28 also accelerates memory by taking advantage of instructions optimized for CPU 12, such as the Pentium 4 architecture. For example, ADD and SUB instructions are used instead of conventional INC and DEC instructions since the ADD and SUB instructions are optimized to run more quickly than the INC and DEC instructions. As another example, the MOVNTDQ ("Move Nontemporal Double Quadword") instruction is used to eliminate the use of the WBINVD ("Write Back Invalidate") instruction, which was conventionally used to eliminate the effects of the caches, such as the L1 and L2 caches, but which fails to give consideration to the MCH cache present on Intel designed chipsets. Failure to account for the effects of the cache on the memory test can affect the results of the test since CPU 12 reads from the cache instead of the memory. However, use of the WBINVD instruction is costly to test speed since it flushes the entire cache and sometimes leads to cache misses on subsequent code and stack fetches. In contrast, the MOVNTDQ instruction moves 128-bit data around in memory without using the cache. If the WBINVD instruction is used, the MCH cache affects are eliminated by either disabling the MCH cache or by writing to opposing areas of the MCH cache in a "ping pong" method with a span greater than the size of the cache.

Figure 2:
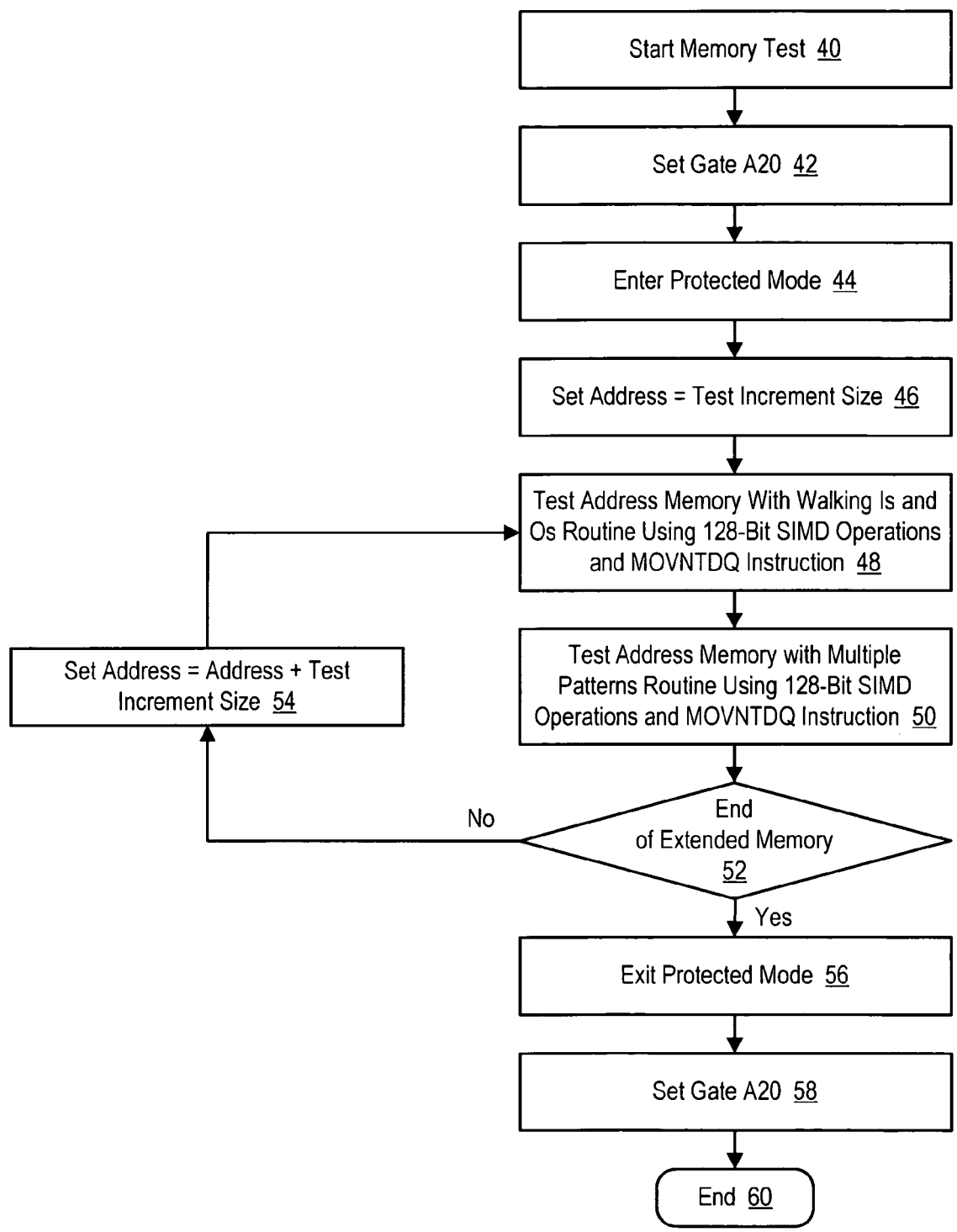
FIG. 2 depicts a flow diagram of a process for accelerating an information handling system memory test.

Referring now to FIG. 2, a flow diagram depicts a process for memory testing during a system start-up, such as boot POST, of a deployed information handling system. The process begins at step 40 with a determination that a memory test is called for, such as where memory has been added to or removed from a system or an interruption of AC power has occurred. At step 42 the gate A20 is set to support memory testing and, at step 44, the memory is placed in protected mode. At step 46, the location of the first portion of memory for testing is identified from the starting address to the address of the test size increment, such as 1 Mbyte. At step 48, the memory identified by the address is written to and read from by a walking 1s and 0s test routine using 128-bit SIMD operations and MOVNTDQ instructions. At step 50, the memory identified by the address is written to and read from by a multi-pattern test routine using 128-bit SIMD operations and MOVNTDQ instructions. Each of the test routines is executed by the CPU as 32-bit code using ADD and SUB instructions to avoid INC and DEC instructions and using 63-bit MMX CPU registers for temporary storage to increase processor operation speed. Failure of a test routine, such as where test data read from memory fails to match test data written to memory, results in an appropriate warning to the user and disabling of the effected memory while passing of the test routines allows the process to continue. At step 52, a determination is made whether the end of the memory has been reached. If not, the process continues to step 54 to set the new test address at an additional test increment size, such as 1 Mbyte, and the process continues to step 48 for another test routine iteration. If the end of memory is reached at step 52, the process continues to step 56 to exit protected mode, step 58 to reset gate A20 and step 60 to end the memory test and continue with startup of the information handling system.

Although the present invention has been described in detail, it should be understood that various changes, substitutions and alterations can be made hereto without departing from the spirit and scope of the invention as defined by the appended claims.

What is claimed is:

1. A method for testing memory of an information handling system, the method comprising:
   initiating startup of the information handling system;
   determining that a memory test is required;
   generating test data according to one or more test routines with the information handling system CPU, the CPU having SIMD registers;
   communicating the test data to and from a predetermined portion of the memory through the SIMD registers; and
   passing the memory test if test data communicated from the memory has a predetermined relationship with the generated test data.

2. The method of claim 1 further comprising:
   using CPU 64-bit MMX registers for temporary storage of the test data.

3. The method of claim 1 wherein the predetermined portion comprises at least one Mbyte, the method further comprising:
   incrementing the memory address of the predetermined portion by the at least one Mbyte;
   repeating the generating, communicating and passing for the incremented portion of memory; and
   repeating the incrementing until each portion of the memory passed the memory test.

4. The method of claim 3 wherein determining an memory test is required further comprises setting the gate A20 to support the memory test before the generating of test data, the method further comprising:
   maintaining the gate A20 setting through each incrementing; and
   resetting the gate A20 after each portion of the memory passes the memory test.

5. The method of claim 3 wherein determining a memory test is required further comprises entering the protected mode before the generating of test data, the method further comprising:
   maintaining the protected mode through each incrementing; and
   exiting the protected mode after each portion of the memory passes the memory test.

6. The method of claim 1 wherein generating the test data further comprises:
   using ADD and SUB instructions; and
   avoiding INC and DEC instructions.

7. The method of claim 6 wherein generating the test data further comprises:
   generating test data with a boundary test routine; and
   generating test data with a stuck bit test routine.

8. The method of claim 7 wherein generating test data further comprises executing 32-bit code on the CPU.

9. The method of claim 1 wherein generating test data further comprises:
   using the MOVNTDQ instruction on the CPU to move test data in the memory in 128-bit increments.

10. An information handling system comprising:
    a CPU operable to perform instructions;
    random access memory interfaced with the CPU and operable to store information;
    a firmware operable to startup the CPU to an operational state, the firmware further operable to coordinate execution of instructions by the CPU to test the memory, the instructions comprising 32-bit code to:
    initiate a memory test during startup;
    generate test data to write to and read from the random access memory using SIMD registers and the MOVNTDQ instruction;
    apply the test data iteratively to predetermined sized portions of the random access memory until the test data has been written to and read from each portion; and
    passing the memory test if test data read from the random access memory has a predetermined relationship with the test data written to the random access memory.

11. The information handling system of claim 10 wherein the instructions to generate test data further comprise instructions to:
    perform a walking 1s and 0s routine; and
    perform a multi-pattern routine.

12. The information handling system of claim 11 wherein the instructions to generate test data comprise ADD and SUB instructions and lack INC and DEC instructions.

13. The information handling system of claim 12 wherein the portions are at least one Mbyte in size.

14. The information handling system of claim 10 further comprising instructions to:
    set gate A20 before generating the test data;
    maintain the gate A20 setting through each iterative application of the test data to the portions; and
    reset gate A20 upon completion of all iterative applications of the test data.

15. The information handling system of claim 10 further comprising instructions to:
    enter a protected mode before generating the test data;
    maintain the protected mode through each iterative application of the test data to the portions; and
    exiting the protected mode upon completion of all iterative applications of the test data.

16. The information handling system of claim 10 further comprising instructions to use 64-bit MMX registers of the CPU for temporary storage of test data.

17. A method for testing memory at boot of an information handling system, the method comprising:
    initiating a memory test during POST;
    generating test data to write to and read from the memory using SIMD registers and the MOVNTDQ instruction;

applying the test data iteratively to predetermined sized portions of the memory until the test data has been written to and read from each portion; and passing the memory test if test data read from the random access memory has a predetermined relationship with the test data written to the random access memory.

18. The method of claim 17 further comprising:

setting gate A20 and entering the protected mode before generating the test data;

maintaining the gate A20 setting and protected mode through each iterative application of the test data to the portions; and resetting gate A20 and exiting the protective mode upon completion of the iterative applications of the test data to each portion of the memory.

19. The method of claim 18 wherein generating test data further comprises:

executing a walking 1s and 0s test routine; and executing a multi-pattern test routine.

20. The method of claim 19 wherein generating test data further comprises executing ADD and SUB instructions.

* * * * *